United States Patent
An et al.

(10) Patent No.: US 12,512,316 B2
(45) Date of Patent: Dec. 30, 2025

(54) HARD MASK FILM INCLUDING GRAPHENE LAYER INTERCALATED STRUCTURE AND MANUFACTURING METHOD THEREOF

(71) Applicant: Samsung Electronics Co., Ltd., Suwon-si (KR)

(72) Inventors: Sungjoo An, Yongin-si (KR); Seran Oh, Hwaseong-si (KR); Yeonuk Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 514 days.

(21) Appl. No.: 17/870,309

(22) Filed: Jul. 21, 2022

(65) Prior Publication Data
US 2023/0170216 A1  Jun. 1, 2023

(30) Foreign Application Priority Data
Nov. 26, 2021 (KR) .................. 10-2021-0165319

(51) Int. Cl.
*H01L 21/033* (2006.01)
*H01L 21/02* (2006.01)

(52) U.S. Cl.
CPC .... *H01L 21/0332* (2013.01); *H01L 21/02115* (2013.01); *H01L 21/022* (2013.01)

(58) Field of Classification Search
CPC ........... H01L 21/0332; H01L 21/02115; H01L 21/022; H01L 21/02274; H01L 21/02271; H01L 21/0337; C01B 32/186; C23C 16/26
See application file for complete search history.

(56) References Cited

U.S. PATENT DOCUMENTS

| | | | |
|---|---|---|---|
| 8,298,931 B2 | 10/2012 | Raghuram et al. | |
| 10,495,972 B2 | 12/2019 | Shin et al. | |
| 10,685,844 B2 | 6/2020 | Kim et al. | |
| 10,777,412 B2 | 9/2020 | Lee et al. | |
| 10,808,142 B2 | 10/2020 | Kim et al. | |
| 2006/0001175 A1* | 1/2006 | Sandhu | H01L 21/3081 257/E21.232 |

(Continued)

FOREIGN PATENT DOCUMENTS

| | | |
|---|---|---|
| CN | 103021838 A | 4/2013 |
| CN | 103137443 A | 6/2013 |

(Continued)

OTHER PUBLICATIONS

Pauliac-Vaujour et al., Improvement of high-resolution lithography by using amorphous carbon hard mask, Microelectronic Engineering, vol. 85, Issues 5â6, 2008, pp. 800-804, doi: 10.1016/j.mee. 2008.02.007 (Year: 2008).*

(Continued)

*Primary Examiner* — William B Partridge
*Assistant Examiner* — Ilker Ozden
(74) *Attorney, Agent, or Firm* — Harness, Dickey & Pierce, P.L.C

(57) ABSTRACT

A hard mask film for use in a process for manufacture of a semiconductor device, comprises a first graphene layer; a first amorphous carbon layer formed on the first graphene layer; a second graphene layer formed on the first amorphous carbon layer; and a second amorphous carbon layer formed on the second graphene layer.

20 Claims, 8 Drawing Sheets

(56) References Cited

U.S. PATENT DOCUMENTS

| | | | | |
|---|---|---|---|---|
| 2012/0281484 | A1* | 11/2012 | Cho | G11C 16/0416 |
| | | | | 977/734 |
| 2013/0217215 | A1 | 8/2013 | Ward et al. | |
| 2014/0048799 | A1* | 2/2014 | Tour | G11C 13/0014 |
| | | | | 257/43 |
| 2014/0206192 | A1* | 7/2014 | Yeom | H01L 21/0405 |
| | | | | 438/720 |
| 2016/0111180 | A1* | 4/2016 | Joo | H10D 30/031 |
| | | | | 73/31.06 |
| 2016/0211142 | A1* | 7/2016 | Kim | H01L 21/0332 |
| 2016/0293609 | A1* | 10/2016 | Jha | C23C 16/45523 |
| 2017/0025273 | A1* | 1/2017 | Shin | H01L 21/02118 |
| 2018/0348626 | A1 | 12/2018 | Ahn et al. | |
| 2019/0100434 | A1 | 4/2019 | Moriguchi et al. | |
| 2020/0133113 | A1 | 4/2020 | Wu et al. | |

FOREIGN PATENT DOCUMENTS

| | | |
|---|---|---|
| CN | 108604057 A | 9/2018 |
| CN | 108884552 A | 11/2018 |
| CN | 109256328 A | 1/2019 |
| KR | 2016/0100172 A | 8/2016 |
| TW | 202010861 A | 3/2020 |
| WO | WO-2019/243009 A1 | 12/2019 |

OTHER PUBLICATIONS

Superlattices and Microstructures, vol. 86, 2015, pp. 270-274, doi: 10.1016/j.spmi.2015.07.067 (Year: 2015).*

Regmi et al., The effect of growth parameters on the intrinsic properties of large-area single layer graphene grown by chemical vapor deposition on Cu, Carbon, vol. 50, Issue 1, 2012, pp. 134-141, doi: 10.1016/j.carbon.2011.07.063 (Year: 2012).*

Shanmugam et al., 2016 Mater. Res. Express 3 125601, doi: 10.1088/2053-1591/3/12/125601 (Year: 2016).*

Masami Kakuchi, Makoto Hikita, Toshiaki Tamamura; Amorphous carbon films as resist masks with high reactive ion etching resistance for nanometer lithography. Appl. Phys. Lett. Mar. 31, 1986; 48 (13): 835â837. https://doi.org/10.1063/1.96683 (Year: 1986).*

Kim et al., Graphene-Based Etch Resist for Semiconductor Device Fabrication, ACS Applied Nano Materials 2020 3 (5), 4635-4641, DOI: 10.1021/acsanm.0c00658 (Year: 2020).*

Li and Yarmoff, Defect-induced oxygen adsorption on graphene films, Surface Science, vol. 675, 2018, pp. 70-77, ISSN 0039-6028, https://doi.org/10.1016/j.susc.2018.05.001 (Year: 2018).*

Zhang et al., Carbon, vol. 49, Issue 13, 2011, doi: 10.1016/j.carbon.2011.06.058 (Year: 2011).*

Office Action dated Aug. 4, 2023 issued in corresponding Taiwanese Patent Application No. 111141365.

Office Action dated Nov. 18, 2025 issued in corresponding Korean Application No. 10-2021-0165319.

* cited by examiner plan view (A)

cross-sectional view (B)

HARD MASK FILM INCLUDING GRAPHENE LAYER INTERCALATED STRUCTURE AND MANUFACTURING METHOD THEREOF

CROSS-REFERENCE TO THE RELATED APPLICATION

This application claims priority from Korean Patent Application No. 10-2021-0165319, filed on Nov. 26, 2021 in the Korean Intellectual Property Office, the disclosure of which is incorporated herein by reference in its entirety.

BACKGROUND

1. Field

Example embodiments of the disclosure relate to a hard mask film including a graphene layer intercalated structure and/or a manufacturing method thereof.

2. Description of the Related Art

Recently, semiconductor industries have been advanced to ultrafine technology that provides a pattern having a size of several to several tens of nanometers. In order to realize such ultrafine technology, effective lithography is needed. Lithography generally includes forming a material layer over a semiconductor substrate, coating a photoresist layer over the material layer, exposing and developing the photoresist layer, thereby forming a photoresist pattern, and then etching the material layer using the photoresist pattern as a mask.

As the size of a pattern to be formed is reduced, it generally may be difficult to form a fine pattern having a good profile using lithography alone. To this end, a "hard mask film" may be formed between the material layer to be etched and the photoresist layer and, as such, a fine pattern may be formed. The hard mask pattern functions as an intermediate film capable of transferring a fine pattern of the photoresist to the material layer through a selective etching process.

In accordance with high integration of a semiconductor device, the line width of the material layer has been reduced gradually, whereas the height of the material layer has been maintained or has been increased relatively, and, as such, the aspect ratio of the material layer has increased. Since the etching process is performed under the above-mentioned conditions, it may be necessary to increase heights of the photoresist layer and the hard mask film pattern. However, there may be a limitation in increasing heights of the photoresist layer and the hard mask film pattern. In addition, the hard mask film pattern may be damaged in an etching procedure for obtaining a material layer having a small line width and, as such, electrical characteristics of the resultant device may be degraded.

SUMMARY

Example embodiments of the disclosure provide a hard mask film capable of maintaining or enhancing etch selectivity while reducing a thickness thereof.

In addition, example embodiments of the disclosure provide a method for manufacturing a hard mask film using the same chamber in manufacture of the hard mask film.

Furthermore, example embodiments of the disclosure provide a hard mask film capable of reducing and/or minimizing ions remaining in a chamber after being formed by a plasma in a process of etching a hard mask.

According to an example embodiment, a hard mask film may be used in a process for manufacturing a semiconductor device. The hard mask film may include a first graphene layer; a first amorphous carbon layer on the first graphene layer; a second graphene layer on the first amorphous carbon layer; and a second amorphous carbon layer on the second graphene layer.

According to an example embodiment, a method for manufacturing a hard mask film may be used in a process for forming a semiconductor device. The method may include forming a first graphene layer on a semiconductor element in one chamber; and forming a plurality of amorphous carbon layers and a plurality of amorphous graphene layers alternately disposed on the first graphene layer in the one chamber.

According to an example embodiment, a hard mask film may be used in an etching process for manufacturing a vertical NAND (VNAND) flash memory. The hard mask film may include a first amorphous carbon layer; a second amorphous carbon layer; and a graphene layer between the first amorphous carbon layer and the second amorphous carbon layer. The graphene layer may have multiple layers and may include an sp3 bond of carbon in a cross-section thereof by bonding between adjacent layers among the multiple layers in the graphene layer. The first amorphous carbon layer, the second amorphous carbon layer, and the graphene layer may be formed in a same chamber through a chemical vapor deposition (CVD) process, respectively.

DETAILED DESCRIPTION

Figure 1:
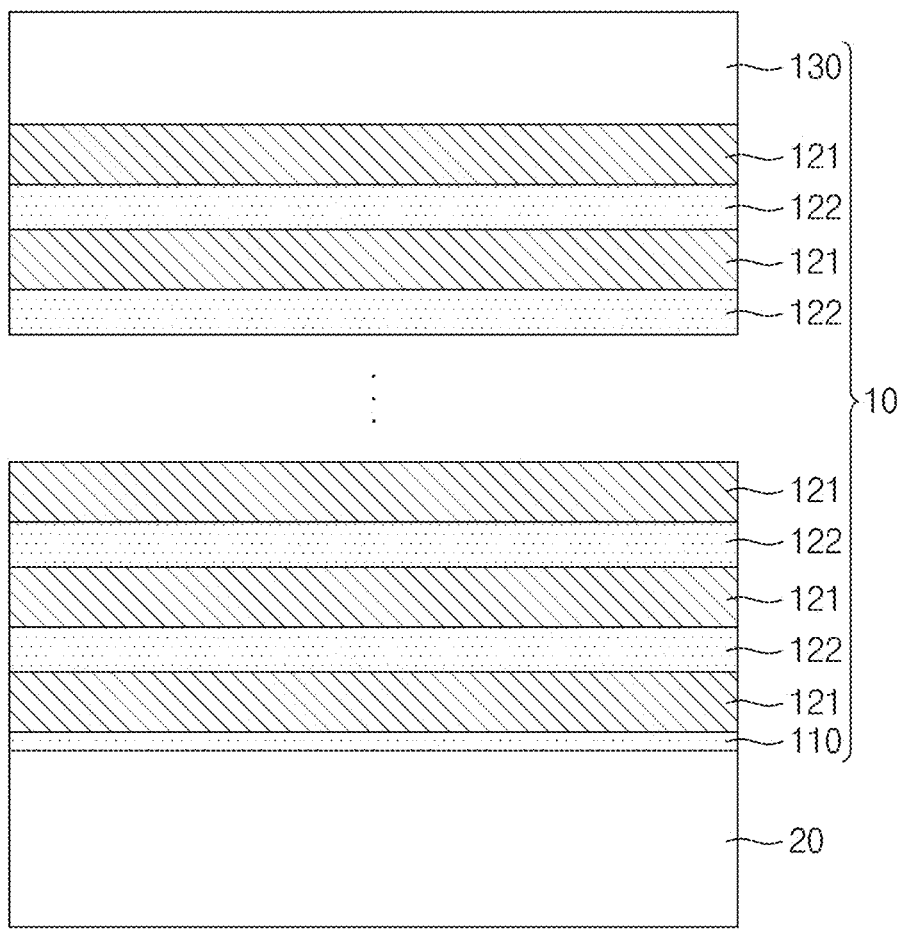
FIG. 1 is a schematic cross-sectional view of a hard mask film according to an example embodiment of the disclosure.

FIG. 1 is a schematic cross-sectional view of a hard mask film according to an example embodiment of the disclosure. For convenience of description given with reference to FIG. 1, an element (for example, "20"), which is disposed under a hard mask film 10 in a deposition process, is also shown in FIG. 1.

In an embodiment, the hard mask film 10 may be used in a process for manufacturing a semiconductor device, such as in an etching process for manufacturing a semiconductor device.

In an embodiment, the hard mask film 10 may be directly disposed over a semiconductor element 20 in a semiconductor process. For example, the semiconductor element 20, which will be a target of an etching process using the hard mask film 10, may include a substrate or may include an insulating layer, a metal layer or a mold layer on the substrate.

For example, the substrate may be made of and/or include a semiconductor such as Si or Ge. In some embodiments, the substrate may include a compound semiconductor including two or more elements, such as SiGe, SiC, GaAs, InAs, or InP. In some embodiments, the substrate may have a silicon-on-insulator (SOI) structure. The substrate may include a conductive region, for example, a well doped with impurities or a structure doped with impurities. In addition, the substrate may have various element isolation structures such as a shallow trench isolation (STI) structure.

For example, the mold layer may include a silicon oxide layer. For example, the mold layer may include a material such as borophosphosilicate glass (BPSG), spin-on dielectrics (SOD), phosphorous silicate glass (PSG), low-pressure tetraethyl orthosilicate (LPTEOS), or plasma-enhanced tetraethyl orthosilicate (PETEOS).

In an embodiment, the semiconductor element 20 may be included in a vertical NAND (VNAND) flash memory as a semiconductor device. For example, the hard mask film 10 may be applied to a manufacturing procedure for a VNAND flash memory (for example, an etching process). In another embodiment, the semiconductor element 20 may be included in a semiconductor memory device such as dynamic random access memory (DRAM), static random access memory (SRAM), NAND flash memory, resistive random access memory (RRAM), etc., a microelectromechanical system (MEMS) device, an optoelectronic device, and a processor such as a CPU or a DSP. For example, the semiconductor element 20 may include an array of vertical NAND cell strings, but example embodiments are not limited thereto.

In an embodiment, the hard mask film 10 may include a first graphene layer 110 (a lower graphene layer), an amorphous carbon layer 121 and a second graphene layer 122 (an intercalated graphene layer), which are repeatedly alternately stacked on the first graphene layer 110, and a coating layer 130. For example, one second graphene layer 122 may be configured to have a structure intercalated between amorphous carbon layers 121 respectively disposed thereover and thereunder.

In an embodiment, one of the amorphous carbon layers 121 may be disposed on an uppermost one of the amorphous carbon layers 121 and the second graphene layer 122 (the intercalated graphene layer) repeatedly alternately stacked in the hard mask film 10. For example, the amorphous carbon layer 121 and the second graphene layer 122, which are repeatedly alternately stacked, may be configured to be stacked in an order of a first amorphous carbon layer (for example, "121" at a lowermost side), a second graphene layer (for example, "122" at a lowermost side), a second amorphous carbon layer (for example, "121" on the second graphene layer), a third graphene layer (for example, "122" on the second amorphous carbon layer), a third amorphous carbon layer (for example, "121" on the third graphene layer), . . . an n-th graphene layer (for example, "122" at an uppermost side), and an n-th amorphous carbon layer (for example, "121" at an uppermost side on the n-th graphene layer). Here, n is a natural number equal to or greater than 4.

In an embodiment, each configuration of the third to n-th graphene layers may be identical to the configuration of the second graphene layer 122 (for example, number of layers, bond structure of carbon, thickness, etc.), and respective configurations of the first to n-th amorphous carbon layers 121 (for example, bond structure of carbon, thickness, etc.) may be identical.

The amorphous carbon layer 121 may also be referred to as an "amorphous carbon layer (ACL)".

In an embodiment, the coating layer 130 may be disposed on the amorphous carbon layer 121 and the second graphene layer 122, which are repeatedly alternately stacked. For example, the coating layer 130 may be disposed on the amorphous carbon layer 121 disposed at the uppermost layer.

In an embodiment, the coating layer 130 may be formed using a spin-on hardmask (SOH) material. In another embodiment, the coating layer 130 may be omitted from the hard mask film 10.

Figure 2:
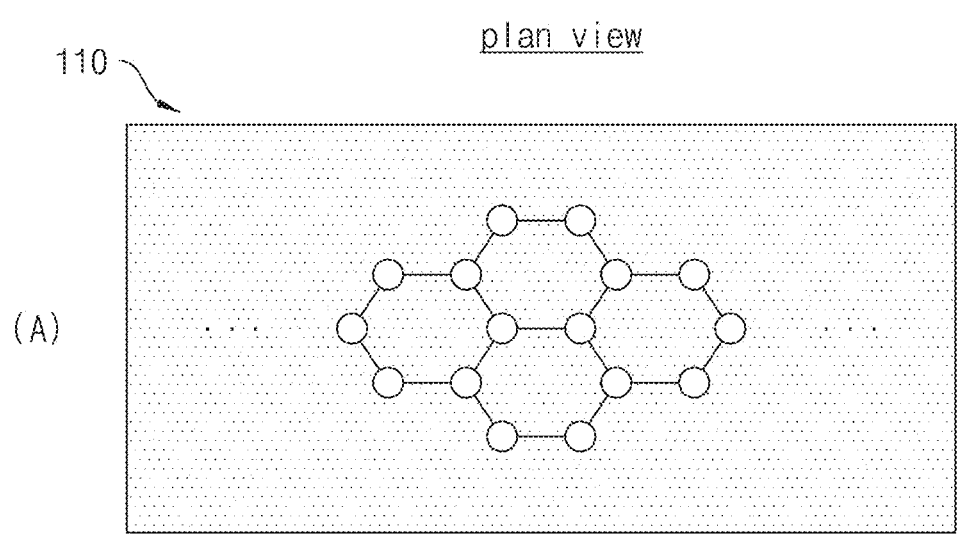
FIG. 2 is a plan view and a cross-sectional view schematically showing the first graphene layer in the hard mask film according to an example embodiment of the disclosure.
Figure 2:
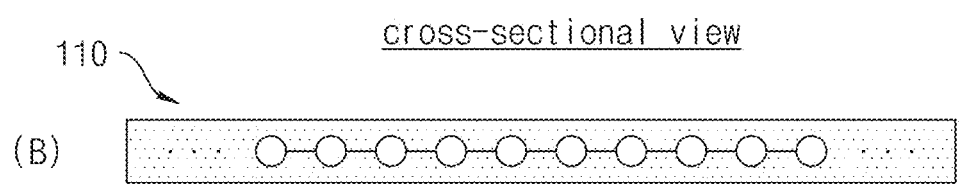
Figure 3:
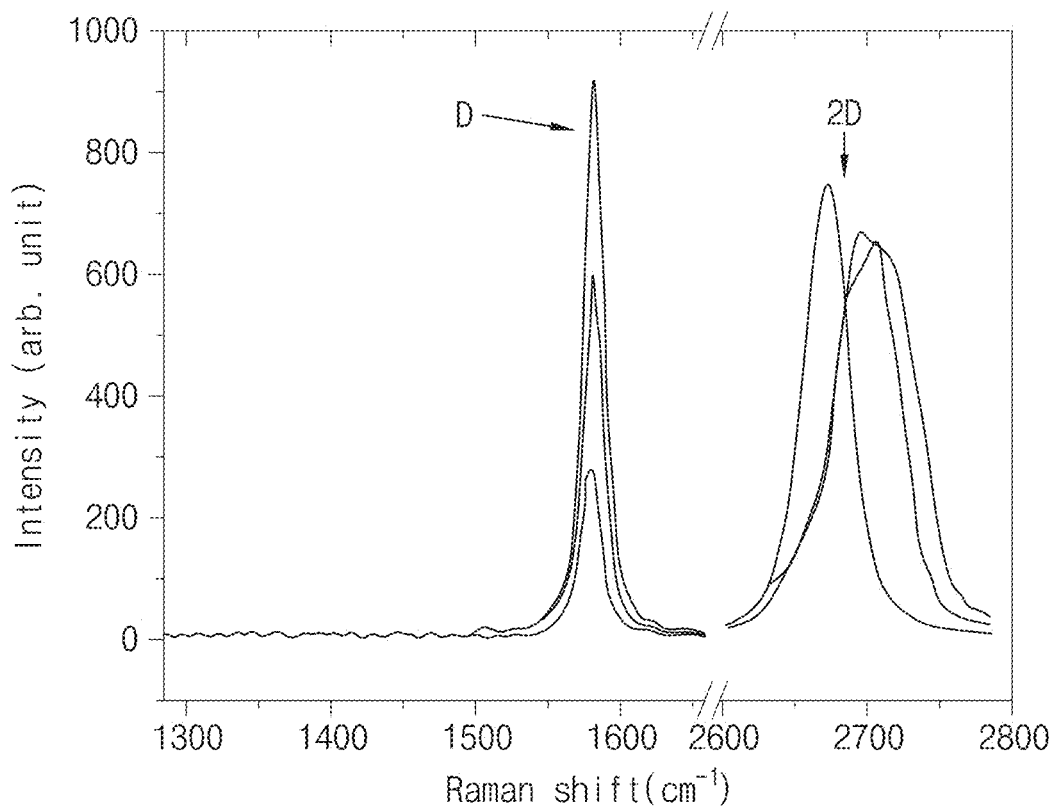
FIG. 3 is a graph depicting spectroscopic information of the first graphene layer in the hard mask film according to an example embodiment of the disclosure.

FIG. 2 is a plan view and a cross-sectional view schematically showing the first graphene layer in the hard mask film according to an example embodiment of the disclosure. FIG. 3 is a graph depicting spectroscopic information of the first graphene layer in the hard mask film according to an example embodiment of the disclosure.

Referring to FIGS. 1 to 3, in an embodiment, the first graphene layer 110 may be disposed under the hard mask film 10. For example, the first graphene layer 110 may be directly disposed over the semiconductor element 20.

The first graphene layer 110 may include graphene. Graphene is a two-dimensional carbon (C) material in which carbon atoms of a single layer are bonded in the form of a honeycomb structure.

In an embodiment, the first graphene layer 110 may be formed in such a manner that the first graphene layer 110 is directly grown on the semiconductor element 20. For example, first, cleaning and surface activation may be performed on a top surface of a semiconductor layer as pretreatment. A flow rate of carbon may be increased in a low pressure state in order to form a nucleation seed for direct growth of graphene at a relatively high density. In an embodiment, the flow rate of carbon for formation of the first graphene layer 110 may be lower than the flow rate of carbon for formation of the amorphous carbon layer 121. In addition, the pressure state for formation of the first graphene layer 110 may be lower than the pressure state for formation of the amorphous carbon layer 121.

In an embodiment, the first graphene layer 110 may be configured to have a D peak and a 2D peak upon Raman spectroscopy, as shown in FIG. 3.

In an embodiment, the first graphene layer 110 may be a single layer. For example, the thickness of the first graphene layer 110 may be 5 to 7 Å. Of course, example embodiments of the disclosure are not limited to the above-described case, and, in another embodiment, the first graphene layer 110 may be multiple layers.

In an embodiment, the first graphene layer 110 may be configured such that carbons have a lateral growth structure of $sp^2$ bonds in cross-section.

Figure 4:
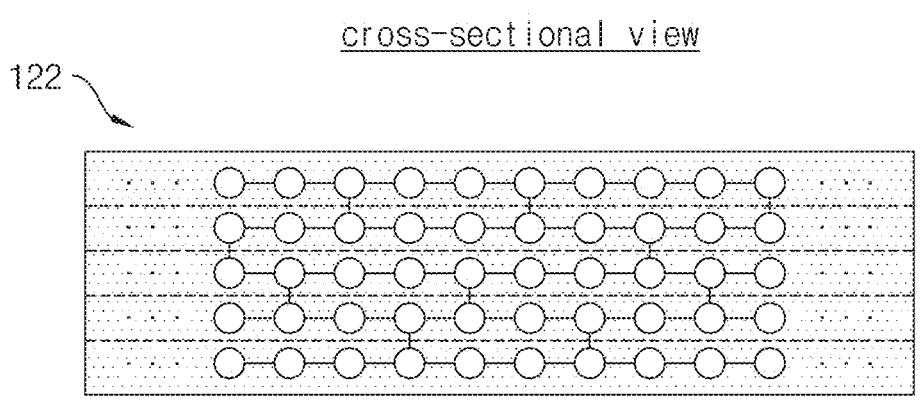
FIG. 4 is a cross-sectional view schematically showing the second graphene layer in the hard mask film according to an example embodiment of the disclosure.

FIG. 4 is a cross-sectional view schematically showing the second graphene layer in the hard mask film according to an example embodiment of the disclosure.

A second graphene layer 122 may include graphene.

Referring to FIG. 4, in an embodiment, the second graphene layer 122 may be multiple layers. In an embodiment, the second graphene layer 122 may be multiple layers having 5 to 6 layers. For example, the thickness of the second graphene layer 122 may be 25 to 40 Å. Of course, example embodiments of the disclosure are not limited to the above-described case, and the second graphene layer 122 may have multiple layers selected from between 2 layers and 20 layers.

In an embodiment, the thickness of the second graphene layer 122 may be different from the thickness of the first graphene layer 110. For example, the thickness of the second graphene layer 122 may be greater than the thickness of the first graphene layer 110.

In an embodiment, the second graphene layer 122 may be formed in such a manner that the second graphene layer 122 is directly grown on the amorphous carbon layer 121. For example, first, cleaning and surface activation may be performed on a top surface of a semiconductor layer as pretreatment. A flow rate of carbon may be increased in a low pressure state in order to form a nucleation seed for direct growth of graphene at a relatively high density. In an embodiment, the flow rate of carbon for formation of the second graphene layer 122 may be lower than the flow rate of carbon for formation of the amorphous carbon layer 121. In addition, the pressure state for formation of the second graphene layer 122 may be lower than the pressure state for formation of the amorphous carbon layer 121.

In an embodiment, the second graphene layer 122 may be configured such that carbons have an $sp^3$ bond structure including bonds formed in a vertical direction in cross-section. For example, bonds may be vertically formed among single graphene layers constituting multiple layers. Accordingly, an $sp^3$ bond structure may be observed at the second graphene layer 122 in cross-section in accordance with a bond formed among carbons adjacent to each other in a horizontal direction in a single layer and a bond formed between carbons adjacent to each other in a vertical direction between single layers.

Since the second graphene layer 122 has the $sp^3$ bond structure, the etch selectivity thereof may be excellent, as compared to that of the amorphous carbon layer 121. The hard mask film 10 according to example embodiments of the disclosure may have excellent etch selectively because the hard mask film 10 includes a plurality of second graphene layers 122, as compared to a mask film formed using only the amorphous carbon layer 121.

In an embodiment, the second graphene layer 122 may be configured to have a D peak and a 2D peak upon Raman spectroscopy.

The hard mask film 10 may have a smaller thickness than the mask film formed using only the amorphous carbon layer 121. Accordingly, the hard mask film 10 may enhance etch selectivity, as compared to a mask film formed using only a carbon layer.

Hereinafter, a manufacturing method of the hard mask film 10 will be described.

Figure 5:
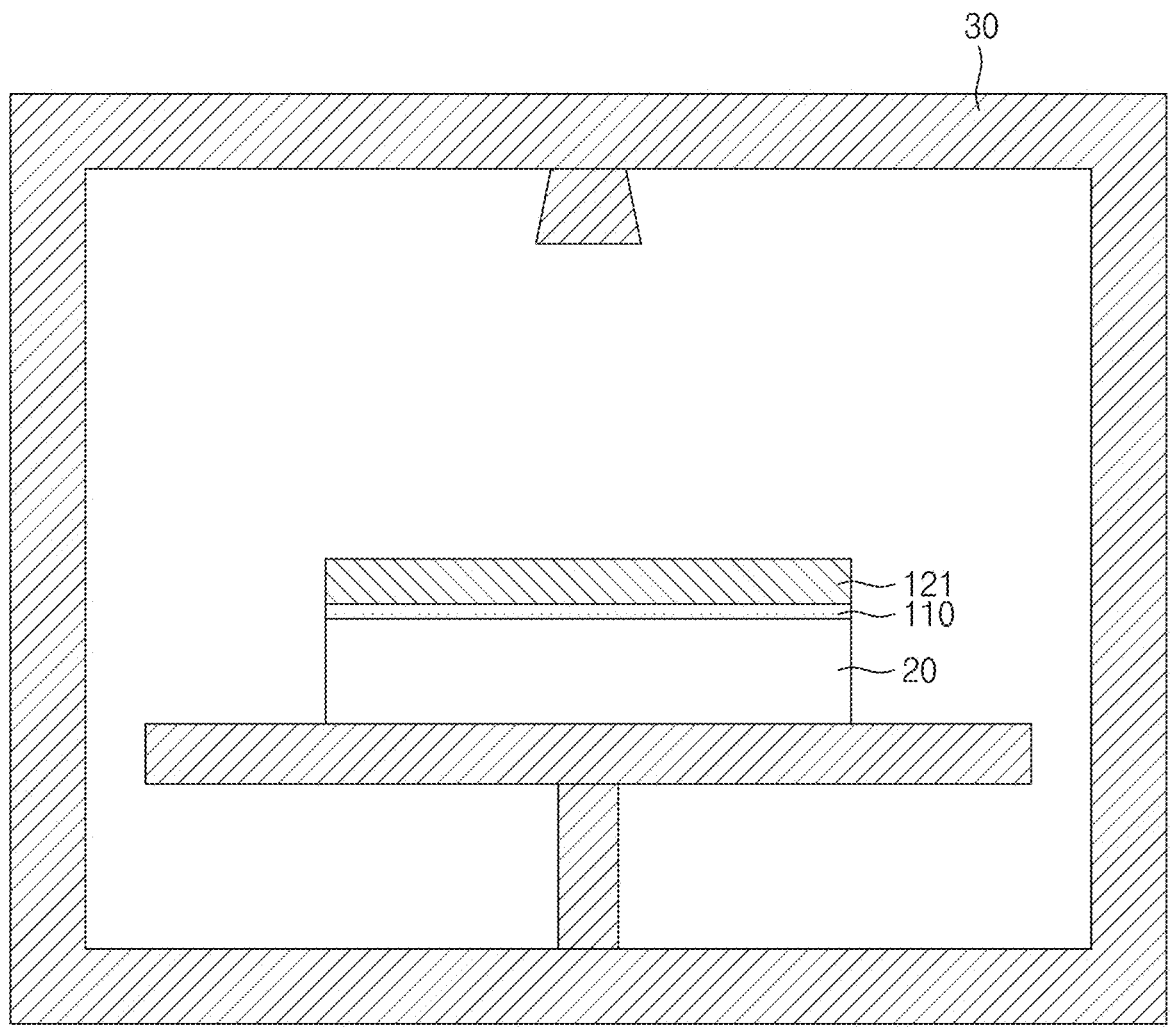
FIGS. 5 and 6 are views schematically showing one procedure in a manufacturing method of a hard mask film according to an example embodiment of the disclosure.
Figure 6:
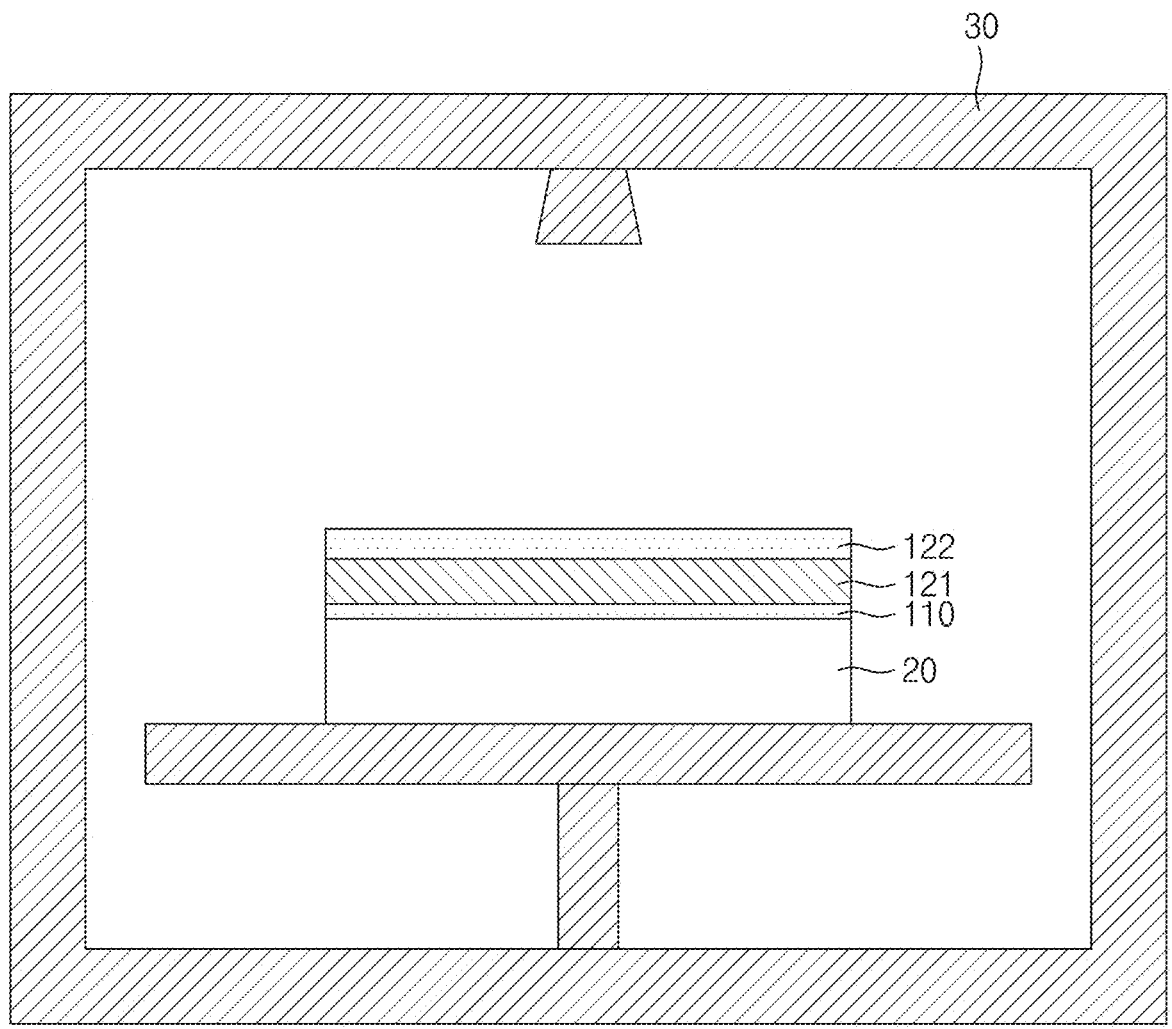

FIGS. 5 and 6 are views schematically showing one procedure in a manufacturing method of a hard mask film according to an example embodiment of the disclosure.

Referring to FIGS. 5 and 6, a first graphene layer 110 may be formed on a semiconductor element 20. Subsequently, an amorphous carbon layer 121 may be formed on the first graphene layer 110. Thereafter, a second graphene layer 122 may be formed on the amorphous carbon layer 121. The amorphous carbon layer 121 and the second graphene layer 122 may be repeatedly alternately stacked.

In an embodiment, each of the first graphene layer 110, and the amorphous carbon layer 121 and the second graphene layer 122, which are repeatedly alternately formed, may be formed through a chemical vapor deposition (CVD) process.

In an embodiment, the first graphene layer 110, and the amorphous carbon layer 121 and the second graphene layer 122, which are repeatedly alternately formed, may be formed by an in-situ process. For example, the first graphene layer 110, the amorphous carbon layer 121, and the second graphene layer 122 may be formed within one chamber 30 without moving to another chamber. For example, the first graphene layer 110, the amorphous carbon layer 121, and the second graphene layer 122 may be formed in one chamber 30. For example, a CVD process may be performed a plurality of times in one chamber 30 and, as such, the first graphene layer 110, the amorphous carbon layer 121, and the second graphene layer 122 may be formed. All of the first graphene layer 110, the amorphous carbon layer 121, and the second graphene layer 122 include carbon and, as such, can be formed in one chamber 30.

Of course, example embodiments of the disclosure are not limited to the above-described case, and the hard mask film 10 may also be formed by an ex-situ process. For example, a part of the first graphene layer 110, the amorphous carbon layer 121, and the second graphene layer 122 may be manufactured in another chamber.

In an embodiment, the pressure range for formation of each of the first graphene layer 110 and the second graphene layer 122 may be 5 Torr or less. In an embodiment, the flow rate of carbon for formation of each of the first graphene layer 110 and the second graphene layer 122 may be 1,000 sccm or less. In this case, a carbon precursor for formation of each of the first graphene layer 110 and the second graphene layer 122 may be a solid or liquid phase. In an embodiment, the temperature range for formation of each of the first graphene layer 110 and the second graphene layer 122 may be 100 to 1,000° C.

Although not clearly shown, a purging/pumping procedure may be performed before formation of the amorphous carbon layer 121 after formation of the first graphene layer 110, before formation of the second graphene layer 122 after formation of the amorphous carbon layer 121, and before formation of the amorphous carbon layer 121 after formation of the second graphene layer 122, respectively.

Figure 7:
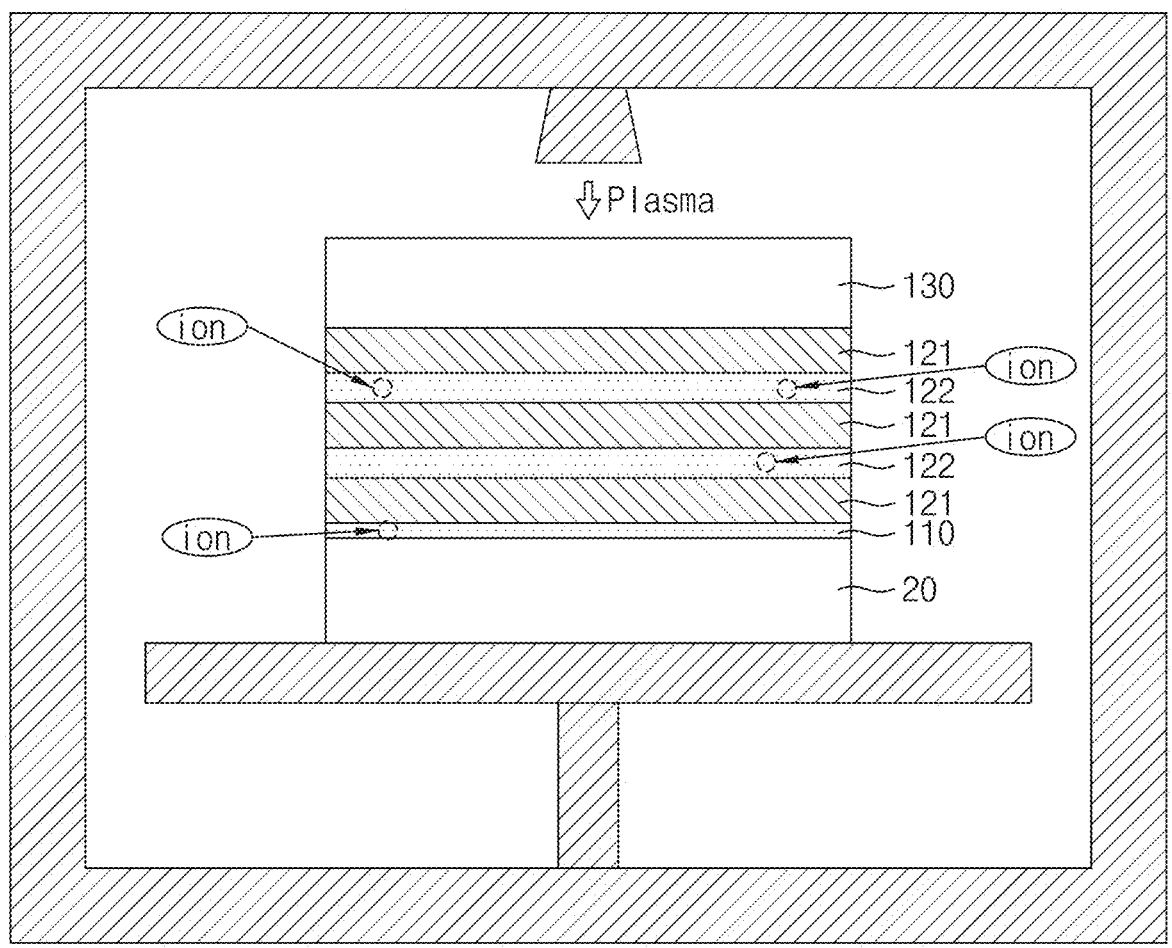
FIG. 7 is a view explaining effects of the hard mask film according to an example embodiment of the disclosure.

FIG. 7 is a view explaining effects of the hard mask film according to an example embodiment of the disclosure.

In an embodiment, an etching process using the hard mask film 10 includes a plasma process. For example, a process gas is excited by a plasma for processing (etching) semiconductor substrates in a chamber 30. The plasma may contain ions having high kinetic energy. In order to manufacture a semiconductor device, an etching process may be performed a plurality of times in the same chamber 30. Meanwhile, after execution of each etching process, ions formed by the plasma may remain in the chamber 30. Here, the plasma may include capacitively coupled plasma (CCP), inductively coupled plasma (ICP), hybrid plasma (ICP+CCP), or microwaves.

Referring to FIG. 7, the first graphene layer 110 and the second graphene layer 122 may include a charging trap function for adsorbing ions remaining in the chamber 30. For example, the plasma may be used in an etching process performed to form the hard mask film 10, and the first graphene layer 110 and the second graphene layer 122 may charging-trap ions remaining in the chamber 30 due to the plasma. Accordingly, successive (continuous) processes in the chamber 30 may be less influenced by a residue (ions) resulting from processes preceding thereto.

Next, a hard mask film according to another example embodiment of the disclosure will be described. In the following description, no description will be given of the same constituent elements as those of FIGS. 1 to 7, and reference numerals identical or similar to those of FIGS. 1 to 7 designate the same constituent elements.

Figure 8:
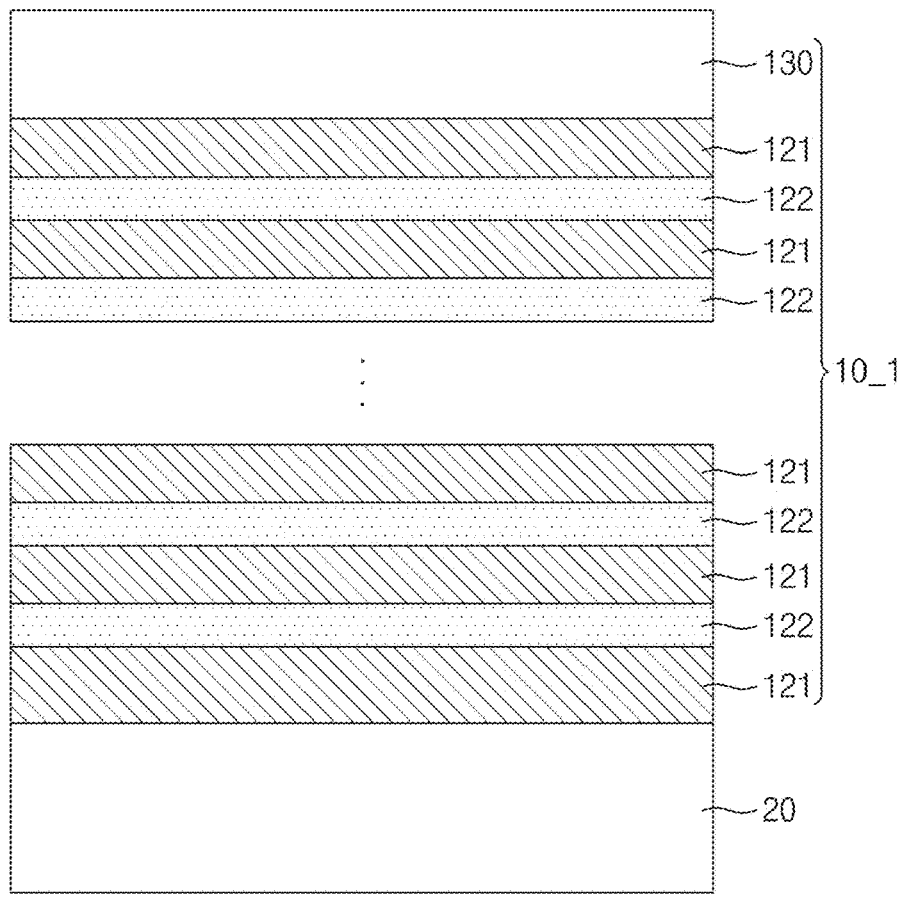
FIG. 8 is a schematic cross-sectional view of a hard mask film according to another example embodiment of the disclosure.

FIG. 8 is a schematic cross-sectional view of a hard mask film according to another example embodiment of the disclosure.

Referring to FIG. 8, a hard mask film 10_1 according to this embodiment differs from the hard mask film 10 according to the embodiment of FIG. 1 in that the first graphene layer 110 is omitted.

In an embodiment, the hard mask fila film 10_1 may include an amorphous carbon layer 121 and a second graphene layer 122 which are repeatedly alternately stacked. For example, the hard mask film 10_1 may be configured such that a first amorphous carbon layer (for example, "121" at a lowermost side), a second graphene layer (for example, "122" at a lowermost side), a second amorphous carbon layer (for example, "121" on the second graphene layer), a third graphene layer (for example, "122" on the second amorphous carbon layer), a third amorphous carbon layer (for example, "121" on the third graphene layer), . . . an n-th graphene layer (for example, "122" at an uppermost side), and an n-th amorphous carbon layer (for example, "121" at an uppermost side on the n-th graphene layer) are alternately stacked in the stated order. In an embodiment, the first amorphous carbon layer (for example, "122" at the lowermost side) disposed at a lowermost side of the hard mask film 10_1 may be directly disposed on a semiconductor element 20 in a semiconductor process.

In an embodiment, each configuration of the third to n-th graphene layers may be identical to the configuration of the second graphene layer 122 (for example, number of layers, bond structure of carbon, thickness, etc.), and respective configurations of the first to n-th amorphous carbon layers 121 (for example, bond structure of carbon, thickness, etc.) may be identical.

The hard mask film 10_1 according to this embodiment may be manufactured to have a smaller thickness than the hard mask film 10 according to the embodiment of FIG. 1 in that the first graphene layer 110 is omitted. Accordingly, etch selectively may be enhanced.

Figure 9:
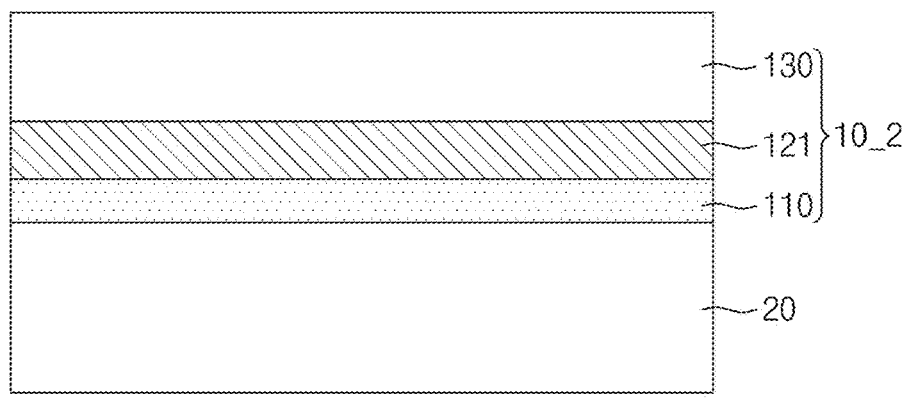
FIG. 9 is a schematic cross-sectional view of a hard mask film according to another example embodiment of the disclosure.

FIG. 9 is a schematic cross-sectional view of a hard mask film according to another example embodiment of the disclosure.

Referring to FIG. 9, a hard mask film 10_2 according to this embodiment differs from the hard mask film 10 according to the embodiment of FIG. 1 in that the second graphene layer 122 is omitted.

In an embodiment, the hard mask film 10_2 may include a first graphene layer 110, an amorphous carbon layer 121 disposed on the first graphene layer 110, and a coating layer 130 disposed on the amorphous carbon layer 121. Here, the first graphene layer 110 may be a single layer or multiple layers.

Figure 10:
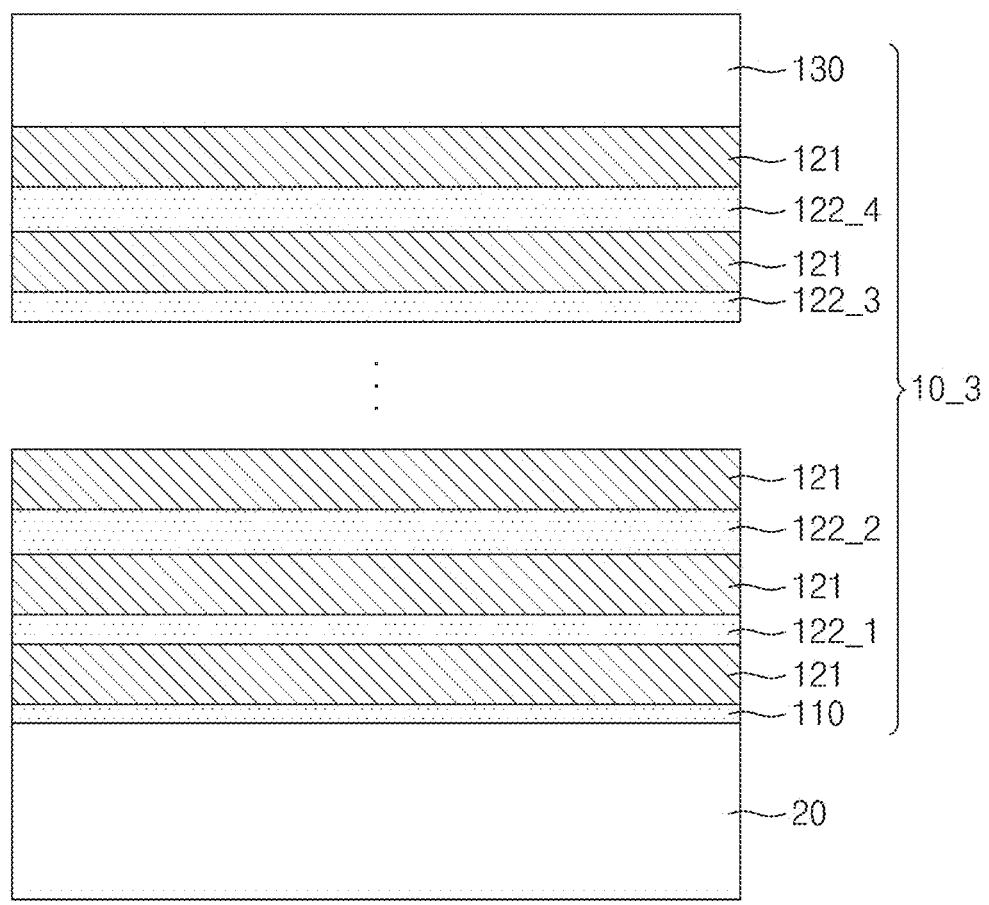
FIG. 10 is a schematic cross-sectional view of a hard mask film according to another example embodiment of the disclosure.

FIG. 10 is a schematic cross-sectional view of a hard mask film according to another example embodiment of the disclosure.

Referring to FIG. 10, a hard mask film 10_3 according to this embodiment differs from the hard mask film 10 according to the embodiment of FIG. 1 in that at least a part of second graphene layers 122 constituting the hard mask film 10_3 has a different thickness.

In an embodiment, a part of a plurality of second graphene layers 122 constituting the hard mask film 10_3 may be constituted by layers different in number from layers of another part of the plurality of second graphene layers 122. Accordingly, the part of the plurality of second graphene layers 122 constituting the hard mask film 10_3 may have a thickness different from that of the other part of the plurality of second graphene layers 122.

In some embodiments, a part of the plurality of second graphene layers 122 constituting the hard mask film 10_3 may be a single layer.

Although not clearly shown, in some embodiments, a part of a plurality of amorphous carbon layers 121 constituting the hard mask film 10_3 may have a thickness different from that of another part of the plurality of amorphous carbon layers 121.

In accordance with example embodiments of the disclosure, it may be possible to maintain or enhance etch selectivity even when a hard mask film having a small thickness is used in a semiconductor process.

In addition, a hard mask film may be manufactured by an in-situ process and, as such, manufacturing costs and manufacturing time may be reduced.

Furthermore, a hard mask film may be formed by a plasma in an etching process and, as such, it may be possible to charging-trap ions remaining in a chamber.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A hard mask film directly on a semiconductor element of a semiconductor memory device, comprising:
a first graphene layer;
a first amorphous carbon layer on the first graphene layer;
a second graphene layer on the first amorphous carbon layer; and
a second amorphous carbon layer on the second graphene layer,
wherein the semiconductor element of the semiconductor memory device includes an insulating layer, a metal layer, or a mold layer,
wherein the first graphene layer and the second graphene layer are configured to induce a charging-trap function for adsorbing residual plasma ions during an etching process.

2. The hard mask film according to claim 1, wherein the second graphene layer is multiple layers.

3. The hard mask film according to claim 2, wherein the second graphene layer comprises an $sp^3$ bond of carbon in a cross-section thereof.

4. The hard mask film according to claim 2, wherein the first graphene layer is a single layer.

5. The hard mask film according to claim 2, wherein the second graphene layer has 5 to 6 layers.

6. The hard mask film according to claim 1, wherein a thickness of the second graphene layer is different from a thickness of the first graphene layer.

7. The hard mask film according to claim 6, wherein:
the thickness of the first graphene layer is 5 to 7 Å; and
the thickness of the second graphene layer is 25 to 40 Å.

8. The hard mask film according to claim 1, further comprising a coating layer on the second amorphous carbon layer.

9. A method for manufacturing a hard mask film, comprising:
   forming a first graphene layer on a semiconductor element in one chamber; and
   forming a plurality of amorphous carbon layers and a plurality of graphene layers alternately disposed on the first graphene layer in the one chamber, wherein
   the forming the first graphene layer on the semiconductor element in the one chamber and the forming the plurality of amorphous carbon layers and the plurality of graphene layers are formed by an in-situ process in the one chamber,
   wherein the first graphene layer and the plurality of graphene layers are configured to induce a charging-trap function for adsorbing residual plasma ions during an etching process.

10. The method according to claim 9, wherein the forming the plurality of amorphous carbon layers and the plurality of graphene layers comprises:
   forming a first amorphous carbon layer on the first graphene layer;
   forming a second graphene layer on the first amorphous carbon layer in the one chamber; and
   forming a second amorphous carbon layer on the second graphene layer in the one chamber.

11. The method according to claim 10, wherein each of the first graphene layer, the first amorphous carbon layer, the second graphene layer, and the second amorphous carbon layer are formed through a chemical vapor deposition (CVD) process.

12. The method according to claim 11, wherein the first graphene layer, the first amorphous carbon layer, the second graphene layer, and the second amorphous carbon layer are sequentially formed in the one chamber.

13. The method according to claim 10, wherein the second graphene layer is formed in a pressure state lower than a pressure state in which the first amorphous carbon layer is formed.

14. The method according to claim 13, wherein the second graphene layer is formed in a pressure state of 5 Torr or less.

15. The method according to claim 10, wherein the second graphene layer is formed in a carbon flow rate state lower than a carbon flow rate state in which the first amorphous carbon layer is formed.

16. The method according to claim 15, wherein the second graphene layer is formed in a carbon flow rate state of 1,000 sccm or less.

17. The method according to claim 10, wherein
   the first graphene layer is a single layer; and
   the second graphene layer includes multiple layers.

18. The method according to claim 10, wherein
   the second graphene layer has 5 to 6 layers, and
   the second graphene layer comprises an $sp^3$ bond of carbon in a cross-section by bonding between adjacent layers among the 5 to 6 layers of the second graphene layer.

19. The method according to claim 9, wherein the forming the plurality of amorphous carbon layers and the plurality of graphene layers comprises a purging/pumping procedure performed between forming a corresponding amorphous carbon layer and a corresponding graphene layer among the plurality of amorphous carbon layers and the plurality of graphene layers.

20. A hard mask film directly on a semiconductor element of a semiconductor memory device, comprising:
   a first amorphous carbon layer;
   a second amorphous carbon layer; and
   a graphene layer between the first amorphous carbon layer and the second amorphous carbon layer,
   the graphene layer having multiple layers and including an $sp^3$ bond of carbon in a cross-section thereof by bonding between adjacent layers among the multiple layers in the graphene layer,
   wherein the semiconductor element of the semiconductor memory device includes an insulating layer, a metal layer, or a mold layer,
   wherein the graphene layer is configured to induce a charging-trap function for adsorbing residual plasma ions during an etching process.

* * * * *